(12) United States Patent
Chou et al.

(10) Patent No.: US 8,294,035 B2
(45) Date of Patent: Oct. 23, 2012

(54) PRINTED CIRCUIT BOARD TO PREVENT ELECTROSTATIC DISCHARGE AND MANUFACTURING METHOD THEREOF

(75) Inventors: Wei-Chieh Chou, Taipei Hsien (TW); Chun-Jen Chen, Taipei Hsien (TW); Duen-Yi Ho, Taipei Hsien (TW); Tsung-Sheng Huang, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 140 days.

(21) Appl. No.: 12/730,238

(22) Filed: Mar. 24, 2010

(65) Prior Publication Data
US 2011/0186337 A1  Aug. 4, 2011

(30) Foreign Application Priority Data
Feb. 2, 2010  (TW) ................ 99102940 A

(51) Int. Cl.
*H05K 1/09*  (2006.01)

(52) U.S. Cl. ........ 174/257; 361/679; 361/792; 361/795; 174/262; 174/263; 174/266

(58) Field of Classification Search ........... 361/679, 361/792–795; 174/262–266
See application file for complete search history.

(56) References Cited

U.S. PATENT DOCUMENTS

| | | | |
|---|---|---|---|
| 7,045,719 B1 * | 5/2006 | Alexander et al. | 174/262 |
| 7,626,270 B2 * | 12/2009 | Chen et al. | 257/774 |

* cited by examiner

*Primary Examiner* — Yuriy Semenenko
*Assistant Examiner* — Andargie M Aychillhum
(74) *Attorney, Agent, or Firm* — Altis Law Group, Inc.

(57) ABSTRACT

A printed circuit board (PCB) can prevent electrostatic discharge. A number of vias are embedded in the PCB. A circular insulated member is disposed between each via and the number of vias. Each via includes a layer of metal coated on an inner wall of a corresponding insulated member and a through hole bounded by the corresponding insulated member. An acute angle between two tangents which pass through a point of intersection of two overlapped insulated members is greater than twenty degrees.

8 Claims, 3 Drawing Sheets

PRINTED CIRCUIT BOARD TO PREVENT ELECTROSTATIC DISCHARGE AND MANUFACTURING METHOD THEREOF

BACKGROUND

1. Technical Field

The present disclosure relates to printed circuit boards and, particularly, to a printed circuit board that prevents electrostatic discharge damage.

2. Description of Related Art

During the manufacture and assembly of printed circuit boards (PCBs), electronic charges on the surface of an operator's body may be released through electrostatic discharge upon contacting the PCBs. A common point of such discharging is usually on an edge of the PCB; in general, the electrostatic discharge often takes place on the edge of the PCB. Because the electrostatic current often discharges to ground through a route which has a shortest distance and minimal impedance, the electrostatic current flows to vias from the edge of the PCB, and in doing so, passes through one or more of the electronic components on the PCB. The electrostatic current may thereby damage the electronic components.

DETAILED DESCRIPTION

Figure 1:
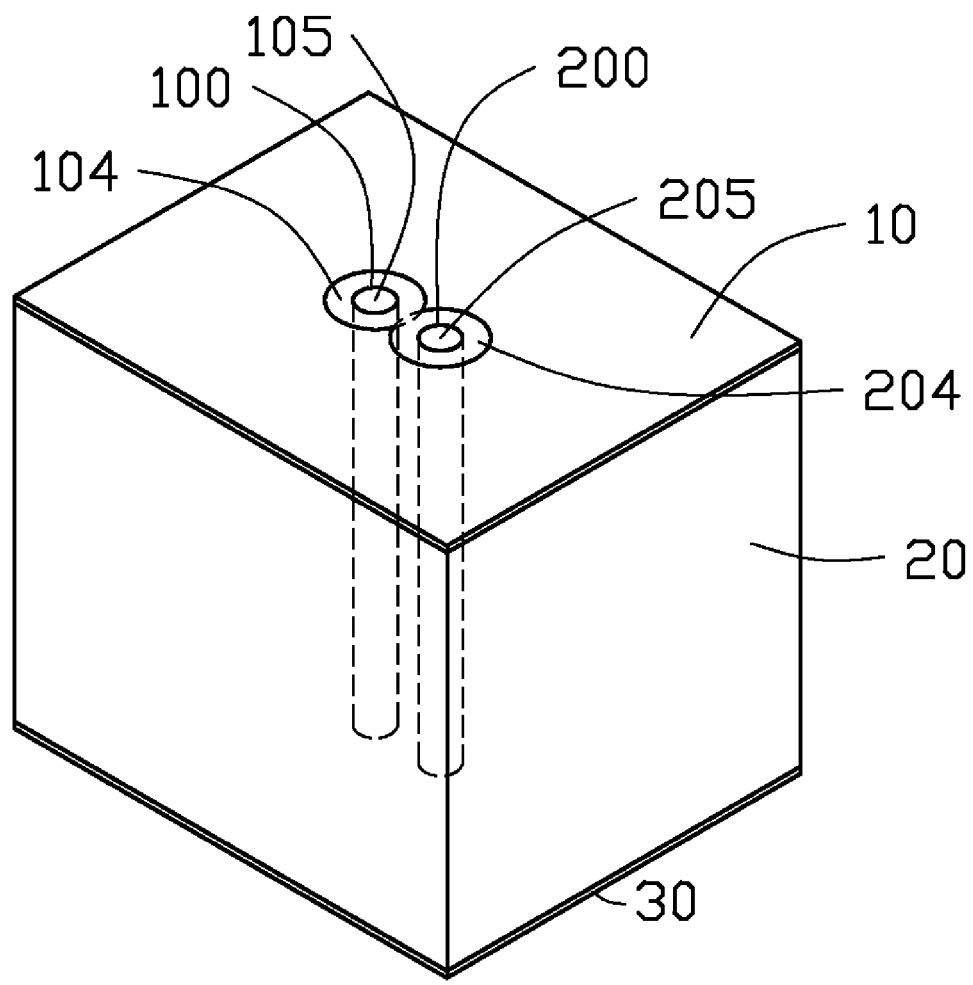
FIG. 1 is a schematic diagram of an exemplary embodiment of a printed circuit board (PCB) to prevent electrostatic discharge, the PCB includes a plurality of vias and insulated members.
Figure 2:
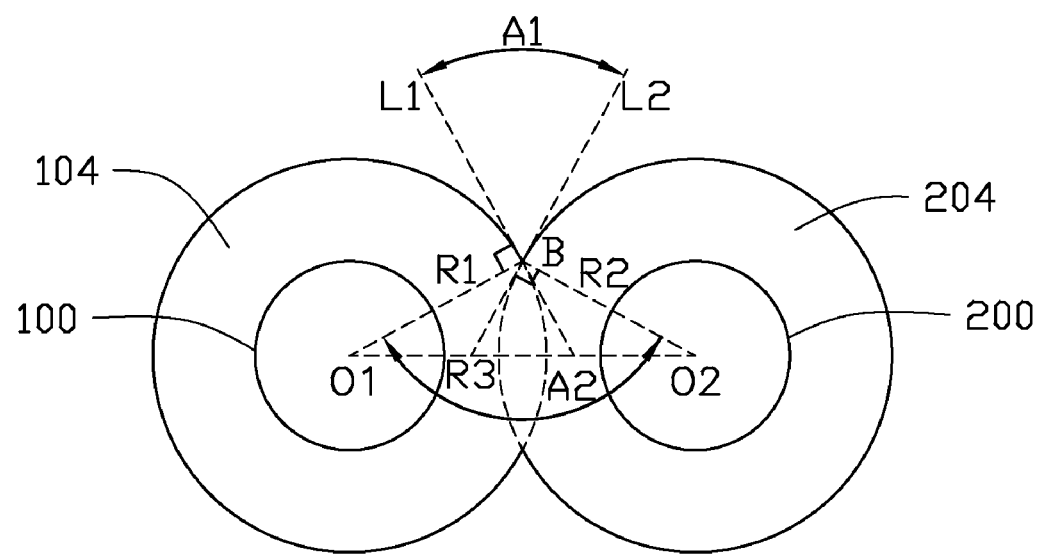
FIG. 2 is a top plan view of the plurality of vias and insulated members of FIG. 1.

Referring to FIGS. 1 and 2, an exemplary embodiment of a printed circuit board (PCB) to prevent electrostatic discharge includes a plurality of sequentially overlapped layers, such as a power layer 10, a dielectric layer 20, and a ground layer 30. Two round vias 100 and 200 are defined in the PCB through the power layer 10, the dielectric layer 20, and the ground layer 30. Circular insulated members 104, 204 are embedded in the plurality of layers and disposed between the plurality of layers and each of the vias 100 and 200. Inner walls of the insulated members 104, 204 are coated with a layer of metal, such as copper or tin, to provide connections among the plurality of layers. The via 100 includes the layer of metal and a through hole 105 bounded by the insulated member 104. The via 200 includes the layer of metal and a through hole 205 bounded by the insulated member 204. The insulated members 104 and 204 can prevent the vias 100 and 200 from contacting the plurality of layers.

Figure 3:
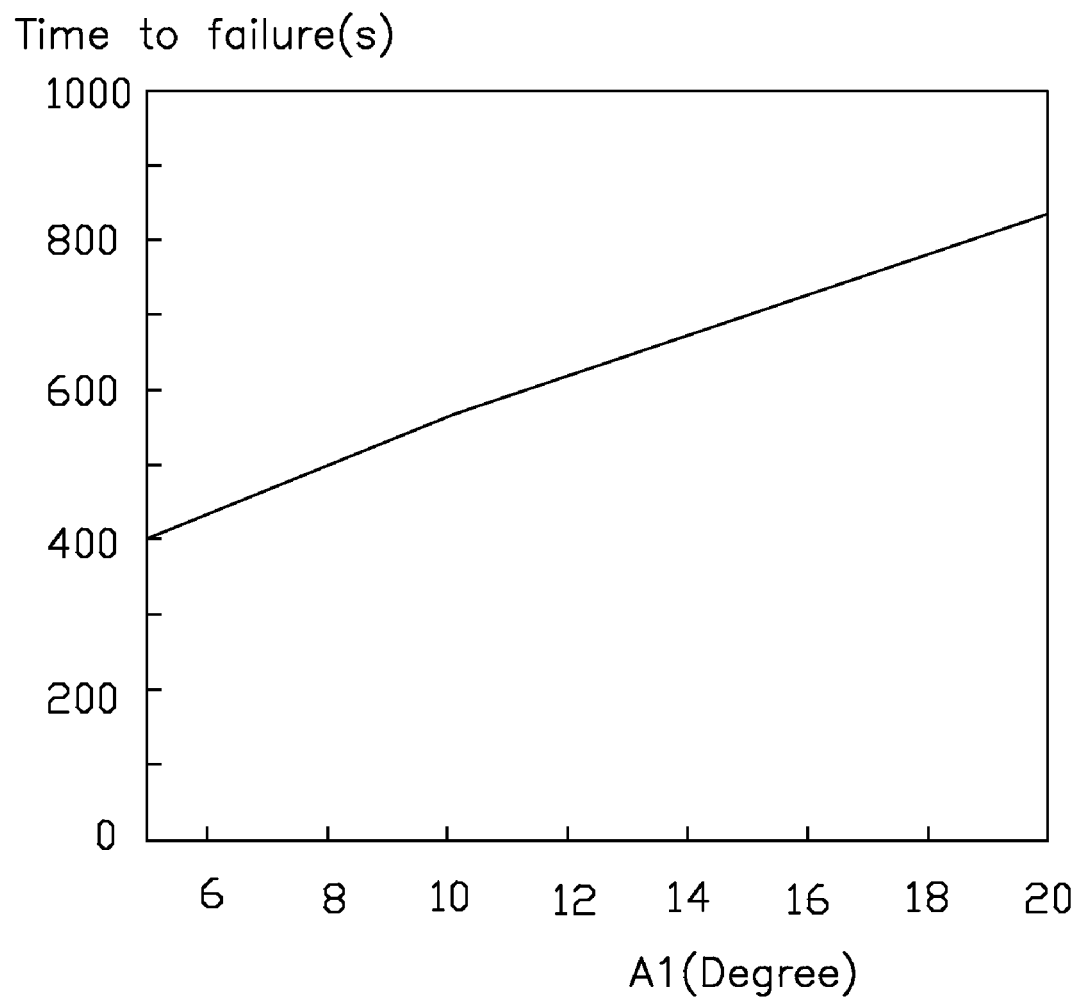
FIG. 3 is a graph of time to failure of the PCB of FIG. 1.

To prevent damage caused by electrostatic discharge at a point formed by overlapping of two adjacent insulated members (e.g., the insulated members 104, 204), an acute angle A1 between two tangents L1 and L2 which pass through a point of intersection B of two adjacent insulated members 104 and 204 needs to be greater than a preset degree. An experiment was conducted to determine the preset degree as shown in FIG. 3, where the horizontal coordinate represents an acute angle between the two tangents L1 and L2 of the insulated members 104 and 204, and the longitudinal coordinate represents the time with respect to the failure of the PCB. It was found that the greater the angle A1 the longer the time to failure from electrostatic discharge. In the PCB industry, a standard time to failure of the PCB is greater than 830 seconds. In FIG. 3, a conclusion can be drawn that the time to failure increases with increasing of the acute angle A1 between the tangents L1 and L2, and the time to failure is 835 seconds (meeting the standard value) when the acute angle A1 is about twenty degrees. In this embodiment, the preset degree is set to be twenty degrees.

If radii of the insulated members 104 and 204 are R1, R2, respectively, and centers of the vias 100 and 200 are O1 and O2, respectively, an angle between the line O1B and line O2B is A2. The angle A2 is a complement of the acute angle A1. In the triangle O1 O2B, a distance R3 between the center O1 of the via 100 and the center O2 of the via 200 is calculated as a formula of $R3=\sqrt{R1^2+R2^2-2*R1*R2*\cos A2}$. The radius R1 of the insulated member 104 and the radius R2 of the insulated member 204, and the angle A2 are known, thereby the distance R3 can be calculated.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A printed circuit board (PCB) to prevent electrostatic discharge, the PCB comprising: a plurality of layers; two overlapped circular insulated members embedded in the plurality of layers; and two vias each comprising a layer of metal coated on an inner wall of a corresponding insulated member and a through hole bounded by the corresponding insulated member; wherein an acute angle between two tangents which pass through a point of intersection of the insulated members is greater than an angle corresponding to a desired minimum time to failure of the PCB, wherein the desired minimum time is equal to 830 seconds.

2. The PCB of claim 1, wherein the plurality of layers comprises a power layer, a dielectric layer, and a ground layer.

3. The PCB of claim 1, wherein the layer of metal is copper.

4. The PCB of claim 1, wherein the layer of metal is tin.

5. A method for manufacturing a printed circuit board (PCB) to prevent electrostatic discharge, comprising: forming a plurality of layers; forming two overlapped circular insulated members to embed in the plurality of layers; and forming two vias each comprising a layer of metal coated on an inner wall of a corresponding insulated member and a through hole bounded by the corresponding insulated member to form an acute angle between two tangents which pass through a point of intersection of the insulated members greater than an angle corresponding to a desired minimum time to failure of the PCB, wherein the desired minimum time is equal to 830 seconds.

6. The method of claim 5, wherein the plurality of layers is formed by stacking a power layer, a dielectric layer, and a ground layer.

7. The method of claim 5, wherein the layer of metal is formed by copper.

8. The method of claim 5, wherein the layer of metal is formed by tin.

* * * * *